United States Patent
Yamaji et al.

(10) Patent No.: US 12,386,084 B2
(45) Date of Patent: Aug. 12, 2025

(54) RADIATION DETECTOR, AND RADIATION DETECTOR MANUFACTURING METHOD

(71) Applicant: HAMAMATSU PHOTONICS K.K., Hamamatsu (JP)

(72) Inventors: Haruki Yamaji, Hamamatsu (JP); Jun Sakurai, Hamamatsu (JP); Kazuhiro Shirakawa, Hamamatsu (JP); Masashi Hatanaka, Hamamatsu (JP); Keisuke Goto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 18/265,731

(22) PCT Filed: Nov. 8, 2021

(86) PCT No.: PCT/JP2021/040999
§ 371 (c)(1),
(2) Date: Jun. 7, 2023

(87) PCT Pub. No.: WO2022/137845
PCT Pub. Date: Jun. 30, 2022

(65) Prior Publication Data
US 2025/0076525 A1 Mar. 6, 2025

(30) Foreign Application Priority Data
Dec. 23, 2020 (JP) .................... 2020-213314

(51) Int. Cl.
*G01T 1/20* (2006.01)
*H10F 39/18* (2025.01)

(52) U.S. Cl.
CPC ..... *G01T 1/20188* (2020.05); *H10F 39/1898* (2025.01)

(58) Field of Classification Search
CPC ............ G01T 1/20188; G01T 1/20189; G01T 1/20182; G01T 1/202; H10F 39/1898
See application file for complete search history.

(56) References Cited

U.S. PATENT DOCUMENTS

2017/0236609 A1* 8/2017 Tanino ................ G01T 1/2002
250/368

FOREIGN PATENT DOCUMENTS

JP H11-258351 A 9/1999
JP 2001-183464 A 7/2001
(Continued)

OTHER PUBLICATIONS

International Preliminary Report on Patentability mailed Jul. 6, 2023 for PCT/JP2021/040999.

*Primary Examiner* — Kiho Kim
(74) *Attorney, Agent, or Firm* — Faegre Drinker Biddle & Reath LLP

(57) ABSTRACT

A radiation detector includes a sensor panel having a light receiving surface, a first scintillator panel and a second scintillator panel disposed on the light receiving surface in a state of being adjacent to each other along the light receiving surface, and an adhesive layer. The first scintillator panel has a first substrate and a first scintillator layer including a plurality of columnar crystals. The second scintillator panel has a second substrate and a second scintillator layer including a plurality of columnar crystals. The first scintillator layer reaches at least a first portion of the first substrate. The second scintillator layer reaches at least a second portion of the second substrate. The adhesive layer is separated for each of the first scintillator panel and the second scintillator panel.

10 Claims, 9 Drawing Sheets

(56) References Cited

FOREIGN PATENT DOCUMENTS

| | | |
|---|---|---|
| JP | 2002-018870 A | 1/2002 |
| JP | 2002-048870 A | 2/2002 |
| JP | 4018472 B2 | 12/2007 |
| JP | 2009-118943 A | 6/2009 |
| JP | 2012-172972 A | 9/2012 |
| JP | 2019-027950 A | 2/2019 |
| JP | 2020-134253 A | 8/2020 |
| TW | 201732838 A | 9/2017 |

* cited by examiner

RADIATION DETECTOR, AND RADIATION DETECTOR MANUFACTURING METHOD

TECHNICAL FIELD

The present disclosure relates to a radiation detector and a method for manufacturing a radiation detector.

BACKGROUND ART

A radiation detector has been known which includes a sensor panel having a light receiving surface, a scintillator panel disposed on the light receiving surface, and an adhesive layer disposed between the light receiving surface and the scintillator panel (see, for example, Patent Literature 1).

CITATION LIST

Patent Literature

Patent Literature 1: Japanese Patent No. 4018472

SUMMARY OF INVENTION

Technical Problem

In the radiation detector as described above, an increase in area of a radiation detection region is required as the area of the sensor panel is increased. However, when a scintillator layer is formed of a granular phosphor and a binder resin in the scintillator panel, the area of the scintillator panel is easily increased in order to increase the area of the radiation detection region, but a high-resolution radiological image is difficult to be obtained. Meanwhile, when the scintillator layer is formed of a plurality of columnar crystals in the scintillator panel, a high-resolution radiological image is easily obtained, but the area of the scintillator panel is difficult to be increased in order to increase the area of the radiation detection region.

An object of the present disclosure is to provide a radiation detector capable of achieving both an increase in area of a radiation detection region and an increase in resolution of a radiological image, and a method for manufacturing such a radiation detector.

Solution to Problem

A radiation detector of one aspect of the present disclosure includes a sensor panel having a light receiving surface, a first scintillator panel and a second scintillator panel disposed on the light receiving surface in a state of being adjacent to each other along the light receiving surface, and an adhesive layer disposed between the light receiving surface and the first scintillator panel and between the light receiving surface and the second scintillator panel, in which the first scintillator panel has a first substrate and a first scintillator layer including a plurality of columnar crystals formed on the first substrate, the second scintillator panel has a second substrate and a second scintillator layer including a plurality of columnar crystals formed on the second substrate, the first scintillator panel is attached to the light receiving surface by the adhesive layer in a state where the first scintillator layer is positioned on the light receiving surface side with respect to the first substrate, the second scintillator panel is attached to the light receiving surface by the adhesive layer in a state where the second scintillator layer is positioned on the light receiving surface side with respect to the second substrate, an outer edge of the first substrate when viewed from the first scintillator layer side includes a first portion extending along the second scintillator panel, and the first scintillator layer reaches at least the first portion, an outer edge of the second substrate when viewed from the second scintillator layer side includes a second portion extending along the first scintillator panel, and the second scintillator layer reaches at least the second portion, and the adhesive layer is separated for each of the first scintillator panel and the second scintillator panel.

In the radiation detector of one aspect of the present disclosure, the first scintillator panel and the second scintillator panel are disposed on the light receiving surface of the sensor panel in a state of being adjacent to each other along the light receiving surface of the sensor panel. In the first scintillator panel and the second scintillator panel, the first scintillator layer reaches the first portion extending along the second scintillator panel of the outer edge of the first substrate, and the second scintillator layer reaches the second portion extending along the first scintillator panel of the outer edge of the second substrate. Therefore, while each of the first scintillator panel and the second scintillator panel is configured in such a size that the plurality of columnar crystals can be reliably formed, one radiation detection region can be obtained by the first scintillator panel and the second scintillator panel. Moreover, the adhesive layer disposed between the light receiving surface of the sensor panel and the first scintillator panel and between the light receiving surface of the sensor panel and the second scintillator panel is separated for each of the first scintillator panel and the second scintillator panel. Thereby, the time for exposing the adhesive layer outside when each of the first scintillator panel and the second scintillator panel is attached to the light receiving surface of the sensor panel can be shortened, and foreign matter caught between the light receiving surface of the sensor panel and the first scintillator panel and between the light receiving surface of the sensor panel and the second scintillator panel can be suppressed. Further, each of the first scintillator panel and the second scintillator panel can be attached to the light receiving surface of the sensor panel with sufficient accuracy. Due to the above, according to the radiation detector of one aspect of the present disclosure, both of an increase in area of the radiation detection region and an increase in resolution of the radiological image can be achieved.

In the radiation detector of one aspect of the present disclosure, the first substrate and the second substrate each may have flexibility. According to this, improvement in workability when each of the first scintillator panel and the second scintillator panel is attached to the light receiving surface of the sensor panel can be achieved.

In the radiation detector of one aspect of the present disclosure, the first scintillator panel may have a rectangular shape having a one-side length of 300 mm or more when viewed from a thickness direction of the first substrate, and the second scintillator panel may have a rectangular shape having a one-side length of 300 mm or more when viewed from a thickness direction of the second substrate. According to this, an increase in area of the radiation detection region can be easily and reliably achieved.

In the radiation detector of one aspect of the present disclosure, the adhesive layer may contain a pressure-sensitive adhesive or an adhesive. According to this, each of the first scintillator panel and the second scintillator panel can be reliably attached to the light receiving surface of the sensor panel.

In the radiation detector of one aspect of the present disclosure, the first scintillator panel may further have a first protective layer covering the first substrate and the first scintillator layer, and the second scintillator panel may further have a second protective layer covering the second substrate and the second scintillator layer. According to this, the plurality of columnar crystals having deliquescent properties can be protected.

The radiation detector of one aspect of the present disclosure may further include a first moisture-proof layer disposed on the first scintillator panel on a side opposite to the sensor panel, a second moisture-proof layer disposed on the second scintillator panel on a side opposite to the sensor panel, a first protective layer covering the first scintillator panel and the first moisture-proof layer, and a second protective layer covering the second scintillator panel and the second moisture-proof layer. According to this, the plurality of columnar crystals having deliquescent properties can be protected.

The radiation detector of one aspect of the present disclosure may further include a granular phosphor disposed between the first scintillator panel and the second scintillator panel. According to this, deterioration of the image quality of a radiological image at a joint portion between the first scintillator panel and the second scintillator panel can be suppressed.

A method for manufacturing a radiation detector of one aspect of the present disclosure is a method for manufacturing the aforementioned radiation detector, the method including a step of preparing the sensor panel, a step of preparing the first scintillator panel and the second scintillator panel, and a step of attaching each of the first scintillator panel and the second scintillator panel to the light receiving surface by the adhesive layer, in which in the attaching step, the adhesive layer is separated for each of the first scintillator panel and the second scintillator panel.

According to the method for manufacturing the radiation detector of one aspect of the present disclosure, the aforementioned radiation detector can be easily and reliably obtained.

In the method for manufacturing the radiation detector of one aspect of the present disclosure, in the attaching step, before each of the first scintillator panel and the second scintillator panel is attached to the light receiving surface, the adhesive layer may be disposed on each of the first scintillator panel and the second scintillator panel. According to this, the first scintillator panel and the adhesive layer can be handled in a state of being integrated with each other. Similarly, the second scintillator panel and the adhesive layer can be handled in a state of being integrated with each other.

In the method for manufacturing the radiation detector of one aspect of the present disclosure, in the attaching step, before each of the first scintillator panel and the second scintillator panel is attached to the light receiving surface, the adhesive layer may be disposed on the light receiving surface. According to this, the first scintillator panel and the second scintillator panel can be each independently handled.

Advantageous Effects of Invention

According to the present disclosure, it is possible to provide a radiation detector capable of achieving both an increase in area of a radiation detection region and an increase in resolution of a radiological image, and a method for manufacturing such a radiation detector.

DESCRIPTION OF EMBODIMENTS

Figure 1:
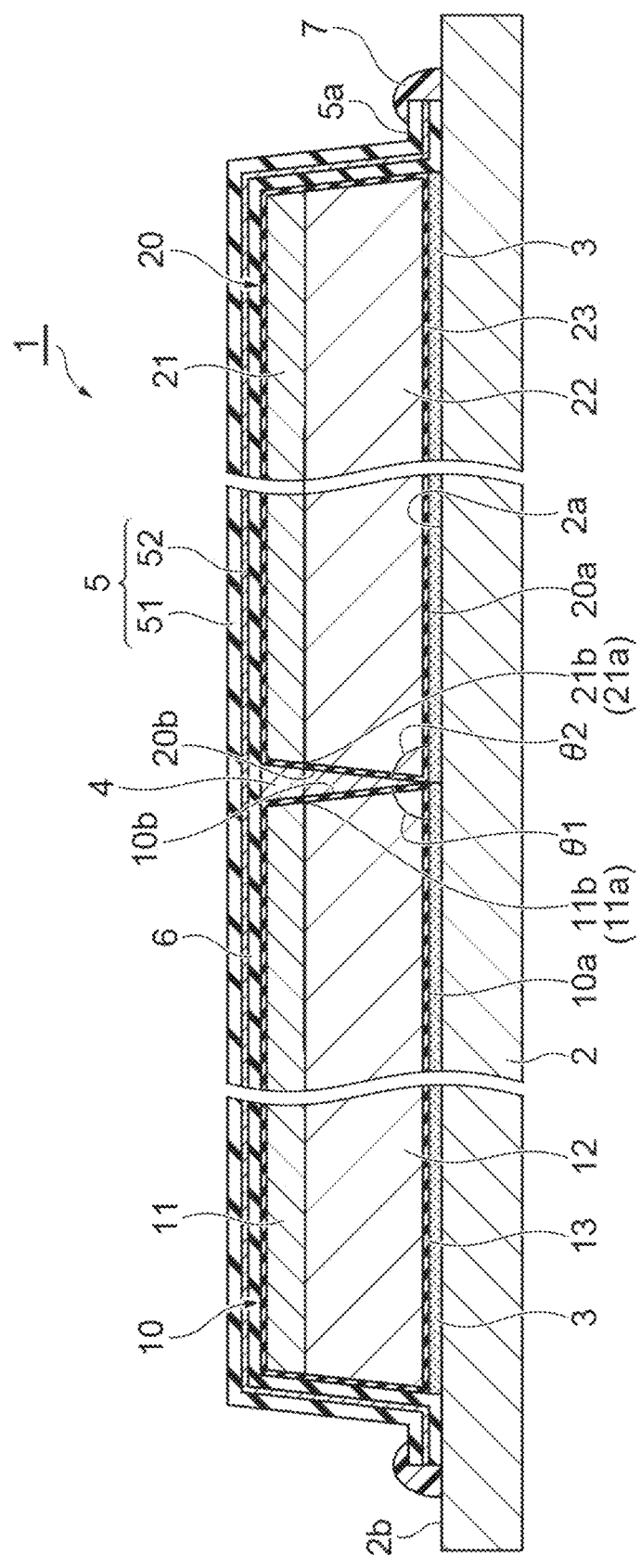
FIG. 1 is a cross-sectional view of a radiation detector of an embodiment.

Hereinafter, embodiments of the present disclosure will be described in detail with reference to the drawings. Note that, in the drawings, the same or corresponding portions will be denoted by the same reference numerals, and redundant description thereof will not be provided.

[Configuration of Radiation Detector]

As illustrated in FIG. 1, a radiation detector 1 includes a sensor panel 2, a first scintillator panel 10, a second scintillator panel 20, an adhesive layer 3, a granular phosphor 4, a moisture-proof layer 5, an adhesive layer 6, and a sealing member 7. In the radiation detector 1, when a radial ray (for example, X ray) enters the first scintillator panel 10 and the second scintillator panel 20, scintillation light is generated in the first scintillator panel 10 and the second scintillator panel 20, and the scintillation light is detected by the sensor panel. The radiation detector 1 is used as a radiation imaging apparatus, for example, in a radiological image diagnostic apparatus for medical use or a nondestructive inspection apparatus.

The sensor panel 2 includes a plurality of photoelectric conversion elements (not illustrated) disposed along a light receiving surface 2a. Each photoelectric conversion element constitutes a pixel and outputs an electrical signal according to the incident scintillation light. The light receiving surface 2a is provided on one main surface of the sensor panel 2. A surface 2b, which is a frame-shaped region encircling the light receiving surface 2a, is provided on the main surface. The sensor panel 2 has flexibility. The material for a substrate on which the plurality of photoelectric conversion elements are provided in the sensor panel 2 is, for example, PI (polyimide), PET (polyethylene terephthalate), PEN (polyethylene naphthalate), PP (polypropylene), PE (polyester), or PMMA (polymethyl methacrylate).

The first scintillator panel 10 and the second scintillator panel 20 are disposed on the light receiving surface 2a in a state of being adjacent to each other along the light receiving surface 2a. The first scintillator panel 10 has a first substrate 11, a first scintillator layer 12, and a first protective layer 13.

The second scintillator panel 20 has a second substrate 21, a second scintillator layer 22, and a second protective layer 23.

The first substrate 11 and the second substrate 21 each have flexibility. The material for each of the first substrate 11 and the second substrate 21 is, for example, PET, PEN, PI, PP, PE, or PMMA. The thickness of each of the first substrate 11 and the second substrate 21 is, for example, 50 µm or more and 250 µm or less. Note that, a functional film may be formed on the front surface and the back surface of each of the first substrate 11 and the second substrate 21. This functional film is, for example, readily adhesive coating, antistatic coating, or a moisture-proof film (polyparaxylylene film). This functional film may be a laminate film including a plurality of films each having a different function.

The first scintillator layer 12 includes a plurality of columnar crystals formed on the first substrate 11. The second scintillator layer 22 includes a plurality of columnar crystals formed on the second substrate 21. The plurality of columnar crystals are formed on the first substrate 11 or the second substrate 21, for example, by evaporating a scintillator material on the first substrate 11 or the second substrate 21. The material for each of the first scintillator layer 12 and the second scintillator layer 22 is, for example, CsI:Tl (cesium iodide containing thallium as an activator), CsI:Na (cesium iodide containing sodium as an activator), CsI:Ce (cesium iodide containing cerium as an activator), or CsI:Tl,Eu (cesium iodide containing thallium and europium as activators). The thickness of each of the first scintillator layer 12 and the second scintillator layer 22 is, for example, 100 µm or more and 1000 µm or less (preferably, 400 µm or more and 800 µm or less).

The first protective layer 13 covers the first substrate 11 and the first scintillator layer 12. The second protective layer 23 covers the second substrate 21 and the second scintillator layer 22. The material for each of the first protective layer 13 and the second protective layer 23 is, for example, parylene (polyparaxylene). The thickness of each of the first protective layer 13 and the second protective layer 23 is, for example, 0.5 µm or more and 20 µm or less.

The first scintillator panel 10 is disposed on the light receiving surface 2a in a state where the first scintillator layer 12 is positioned on the light receiving surface 2a side with respect to the first substrate 11. The first scintillator panel 10 has a rectangular shape having a one-side length of 300 mm or more when viewed from a thickness direction of the first substrate 11. The second scintillator panel 20 is disposed on the light receiving surface 2a in a state where the second scintillator layer 22 is positioned on the light receiving surface 2a side with respect to the second substrate 21. The second scintillator panel 20 has a rectangular shape having a one-side length of 300 mm or more when viewed from a thickness direction of the second substrate 21.

An outer edge 11a of the first substrate 11 when viewed from the first scintillator layer 12 side includes a first portion 11b extending along the second scintillator panel 20. The first scintillator layer 12 reaches the first portion 11b. In the present embodiment, the first scintillator layer 12 reaches the entire portion of the outer edge 11a. An outer edge 21a of the second substrate 21 when viewed from the second scintillator layer 22 side includes a second portion 21b extending along the first scintillator panel 10. The second scintillator layer 22 reaches the second portion 21b. In the present embodiment, the second scintillator layer 22 reaches the entire portion of the outer edge 21a. The first portion 11b of the outer edge 11a of the first substrate 11 and the second portion 21b of the outer edge 21a of the second substrate 21 face each other.

Note that, the first substrate 11 and the first scintillator layer 12 are obtained by forming a scintillator layer including portions corresponding to a plurality of the first scintillator layers 12 on a substrate including portions corresponding to a plurality of the first substrates 11 and then cutting the substrate and the scintillator layer. The second substrate 21 and the second scintillator layer 22 are obtained by forming a scintillator layer including portions corresponding to a plurality of the second scintillator layers 22 on a substrate including portions corresponding to a plurality of the second substrates 21 and then cutting the substrate and the scintillator layer. The first substrate 11 and the first scintillator layer 12 may be obtained by forming a scintillator layer including a portion corresponding to one first scintillator layer 12 on a substrate including a portion corresponding to one first substrate 11 and then clipping the substrate and the scintillator layer. The second substrate 21 and the second scintillator layer 22 may be obtained by forming a scintillator layer including a portion corresponding to one second scintillator layer 22 on a substrate including a portion corresponding to one second substrate 21 and then clipping the substrate and the scintillator layer.

A first angle $\theta 1$ formed by a surface 10a on the sensor panel 2 side (the first scintillator layer 12 side with respect to the first substrate 11) in the first scintillator panel 10 and a side surface 10b on the second scintillator panel 20 side in the first scintillator panel 10 is 45 degrees or more and less than 90 degrees. In the present embodiment, the surface 10a and the entire side surface of the first scintillator panel 10 form an angle of 45 degrees or more and less than 90 degrees. A second angle $\theta 2$ formed by a surface 20a on the sensor panel 2 side (the second scintillator layer 22 side with respect to the second substrate 21) in the second scintillator panel 20 and a side surface 20b on the first scintillator panel 10 side in the second scintillator panel 20 is 45 degrees or more and less than 90 degrees. In the present embodiment, the surface 20a and the entire side surface of the second scintillator panel 20 form an angle of 45 degrees or more and less than 90 degrees. A corner portion of the first scintillator panel 10 formed by the surface 10a and the side surface 10b is in contact with a corner portion of the second scintillator panel 20 formed by the surface 20a and the side surface 20b.

The adhesive layer 3 is disposed between the light receiving surface 2a and the first scintillator panel 10 and between the light receiving surface 2a and the second scintillator panel 20. The first scintillator panel 10 is attached to the light receiving surface 2a by the adhesive layer 3 in a state where the first scintillator layer 12 is positioned on the light receiving surface 2a side with respect to the first substrate 11. The second scintillator panel 20 is attached to the light receiving surface 2a by the adhesive layer 3 in a state where the second scintillator layer 22 is positioned on the light receiving surface 2a side with respect to the second substrate 21. The adhesive layer 3 is separated for each of the first scintillator panel 10 and the second scintillator panel 20. That is, even when the adhesive layer 3 disposed between the light receiving surface 2a and the first scintillator panel 10 and the adhesive layer 3 disposed between the light receiving surface 2a and the second scintillator panel 20 are in contact with each other, they form an interface.

The adhesive layer 3 is a pressure-sensitive adhesive or an adhesive. The pressure-sensitive adhesive means one not cured after adhesion. The adhesive means one cured after adhesion. The material for the adhesive layer 3 is, for example, a light transmissive organic material (for example, OCA (Optical Clear Adhesive)). The thickness of the adhesive layer 3 is, for example, 0.1 µm or more and 100 µm or less (preferably, 25 µm or less).

The granular phosphor 4 is disposed between the first scintillator panel 10 and the second scintillator panel 20. More specifically, the granular phosphor 4 is disposed in a groove with a V-shaped cross section formed by the side surface 10b of the first scintillator panel 10 and the side surface 20b of the second scintillator panel 20. The material for the granular phosphor 4 is, for example, GOS (gadolinium oxysulfide).

The moisture-proof layer 5 covers the first scintillator panel 10 and the second scintillator panel 20 on the sensor panel 2. The moisture-proof layer 5 is disposed on the first scintillator panel 10 and the second scintillator panel 20 on a side opposite to the sensor panel 2 and is provided continuous over the first scintillator panel 10 and the second scintillator panel 20. An outer edge 5a of the moisture-proof layer 5 reaches the surface 2b of the sensor panel 2 (the surface around the light receiving surface 2a).

The moisture-proof layer 5 has a main body layer 51 and an inorganic layer 52. The main body layer 51 has flexibility. The inorganic layer 52 is disposed on the main body layer 51. The inorganic layer 52 is attached to, for example, the main body layer 51 so as to be integrated with the main body layer 51. The moisture-proof layer 5 is disposed on the first scintillator panel 10 and the second scintillator panel 20 in a state where the inorganic layer 52 is positioned on a side of the first scintillator panel 10 and the second scintillator panel 20 with respect to the main body layer 51.

The material for the main body layer 51 is, for example, PET, PEN, PI, PP, PE, or PMMA. The thickness of the main body layer 51 is, for example, 50 µm or more and 250 µm or less. The material for the inorganic layer 52 is, for example, Al (aluminum), Cu (copper), Ti (titanium), Fe (iron), or SUS (stainless steel). The thickness of the inorganic layer 52 is, for example, 10 µm or more and 100 µm or less.

The adhesive layer 6 is disposed between the first scintillator panel 10 and the moisture-proof layer 5, between the second scintillator panel 20 and the moisture-proof layer 5, and between the surface 2b of the sensor panel 2 and the moisture-proof layer 5. The moisture-proof layer 5 is attached to the first scintillator panel 10, the second scintillator panel 20, and the surface 2b of the sensor panel 2. The adhesive layer 6 is a pressure-sensitive adhesive or an adhesive. The thickness of the adhesive layer 6 is, for example, 0.1 µm or more and 100 µm or less (preferably, 25 µm or less).

The sealing member 7 seals the outer edge 5a of the moisture-proof layer 5 in the surface 2b of the sensor panel 2. The sealing member 7 extends along the outer edge 5a in a frame shape. The material for the sealing member 7 is, for example, epoxy, silicone, fluorine, urethane, or acryl. The material for the sealing member 7 may include a filler material formed of an inorganic material such as glass. The material for the filler material may have moisture-proof properties higher than the moisture-proof properties of the main material for the sealing member 7, and is, for example, $SiO_2$ (silicon dioxide), $Al_2O_3$ (aluminum oxide), or $TiO_2$ (titanium oxide).

As described above, in the radiation detector 1, the first scintillator panel 10 and the second scintillator panel 20 are disposed on the light receiving surface 2a of the sensor panel 2 in a state of being adjacent to each other along the light receiving surface 2a of the sensor panel 2. In the first scintillator panel 10 and the second scintillator panel 20, the first scintillator layer 12 reaches the first portion 11b extending along the second scintillator panel 20 of the outer edge 11a of the first substrate 11, and the second scintillator layer 22 reaches the second portion 21b extending along the first scintillator panel 10 of the outer edge 21a of the second substrate 21. Therefore, while each of the first scintillator panel 10 and the second scintillator panel 20 is configured in such a size that the plurality of columnar crystals can be reliably formed, one radiation detection region can be obtained by the first scintillator panel 10 and the second scintillator panel 20. Moreover, the adhesive layer 3 disposed between the light receiving surface 2a and the first scintillator panel 10 and between the light receiving surface 2a and the second scintillator panel 20 is separated for each of the first scintillator panel 10 and the second scintillator panel 20. Thereby, the time for exposing the adhesive layer 3 outside when each of the first scintillator panel 10 and the second scintillator panel 20 is attached to the light receiving surface 2a can be shortened, and foreign matter caught between the light receiving surface 2a and the first scintillator panel 10 and between the light receiving surface 2a and the second scintillator panel 20 can be suppressed. Further, each of the first scintillator panel 10 and the second scintillator panel 20 can be attached to the light receiving surface 2a with sufficient accuracy. If a problem arises in either the first scintillator panel 10 or the second scintillator panel 20, only the scintillator panel having the problem can also be replaced. Due to the above, according to the radiation detector 1, both of an increase in area of the radiation detection region and an increase in resolution of the radiological image can be achieved.

In the radiation detector 1, the first substrate 11 and the second substrate 21 each have flexibility. Thereby, improvement in workability when each of the first scintillator panel 10 and the second scintillator panel 20 is attached to the light receiving surface 2a can be achieved.

In the radiation detector 1, the first scintillator panel 10 has a rectangular shape having a one-side length of 300 mm or more when viewed from the thickness direction of the first substrate 11, and the second scintillator panel 20 has a rectangular shape having a one-side length of 300 mm or more when viewed from the thickness direction of the second substrate 21. Thereby, an increase in area of the radiation detection region can be easily and reliably achieved.

In the radiation detector 1, the adhesive layer 3 contains a pressure-sensitive adhesive or an adhesive. Thereby, each of the first scintillator panel 10 and the second scintillator panel 20 can be reliably attached to the light receiving surface 2a.

In the radiation detector 1, the first scintillator panel 10 has the first protective layer 13 covering the first substrate 11 and the first scintillator layer 12, and the second scintillator panel 20 has the second protective layer 23 covering the second substrate 21 and the second scintillator layer 22. Thereby, the plurality of columnar crystals having deliquescent properties can be protected.

In the radiation detector 1, the granular phosphor 4 is disposed between the first scintillator panel 10 and the second scintillator panel 20. Thereby, deterioration of the image quality of a radiological image at the joint portion between the first scintillator panel 10 and the second scintillator panel 20 can be suppressed.

In the radiation detector 1, the moisture-proof layer 5 disposed on the first scintillator panel 10 and the second scintillator panel 20 on a side opposite to the sensor panel 2 is provided continuous over the first scintillator panel 10 and the second scintillator panel 20. Thereby, moisture can be prevented from coming into the joint portion between the first scintillator panel 10 and the second scintillator panel 20, and the plurality of columnar crystals having deliquescent properties can be reliably protected. Further, even when a difference in expansion and contraction due to a temperature change occurs between the sensor panel 2 and the first scintillator panel 10 and between the sensor panel 2 and the second scintillator panel 20, the joint portion between the first scintillator panel 10 and the second scintillator panel 20 can be prevented from being released from the light receiving surface 2a.

In the radiation detector 1, the moisture-proof layer 5 has the main body layer 51 having flexibility and the inorganic layer 52 disposed on the main body layer 51, and the moisture-proof layer 5 is disposed on the first scintillator panel 10 and the second scintillator panel 20 in a state where the inorganic layer 52 is positioned on a side of the first scintillator panel 10 and the second scintillator panel 20 with respect to the main body layer 51. Thereby, the inorganic layer 52 can function as the moisture-proof layer 5, and the main body layer 51 can function as the protective layer.

In the radiation detector 1, the first angle θ1 formed by the surface 10a on the sensor panel 2 side in the first scintillator panel 10 and the side surface 10b on the second scintillator panel 20 side in the first scintillator panel 10 is 90 degrees or less, and the second angle θ2 formed by the surface 20a on the sensor panel 2 side in the second scintillator panel 20 and the side surface 20b on the first scintillator panel 10 side in the second scintillator panel 20 is 90 degrees or less. Thereby, the joint portion between the first scintillator panel 10 and the second scintillator panel 20 can be prevented from being released from the light receiving surface 2a due to thermal expansion of air at the joint portion. Further, since the first scintillator layer 12 and the second scintillator layer 22 come close to each other, deterioration of the image quality of a radiological image at the joint portion between the first scintillator panel 10 and the second scintillator panel 20 can be suppressed.

In the radiation detector 1, each of the first angle θ1 and the second angle θ2 is 45 degrees or more and less than 90 degrees. Thereby, the joint portion between the first scintillator panel 10 and the second scintillator panel 20 can be more reliably prevented from being released from the light receiving surface 2a due to thermal expansion of air at the joint portion.

In the radiation detector 1, each of the first angle θ1 and the second angle θ2 is less than 90 degrees, and the sensor panel 2 has flexibility. Thereby, the entire radiation detector 1 can be deflected according to the installation environment of the radiation detector 1, and the like. Further, when the entire radiation detector 1 is deflected such that the sensor panel 2 is located outside with respect to the first scintillator panel 10 and the second scintillator panel 20, the first scintillator panel 10 and the second scintillator panel 20 can be prevented from physically interfering with each other.

Figure 4:
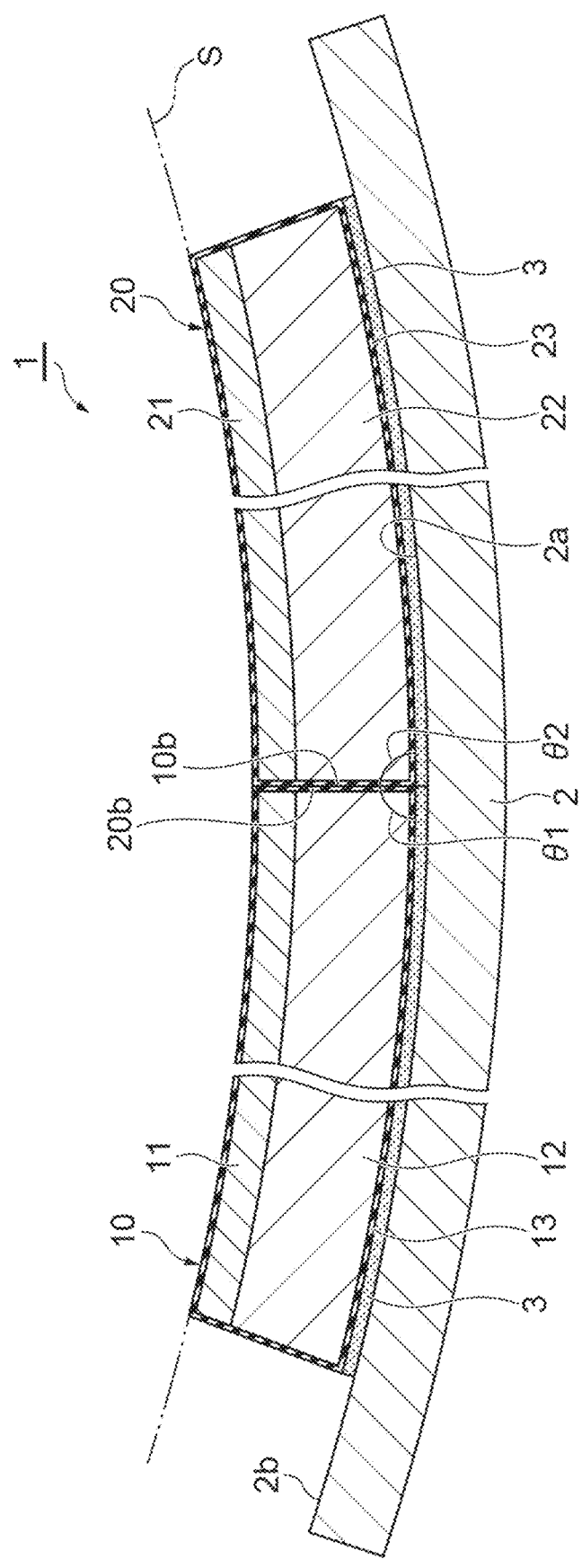
FIG. 4 is a cross-sectional view of a radiation detector of a modification example.

As an example, as illustrated in FIG. 4, the entire radiation detector 1 can be deflected such that the first scintillator panel 10 and the second scintillator panel 20 are disposed along a cylindrical surface S. At this time, since each of the first angle θ1 and the second angle θ2 is less than 90 degrees, the first scintillator panel 10 and the second scintillator panel 20 can be prevented from physically interfering with each other. Note that, the radiation detector 1 illustrated in FIG. 4 does not include the granular phosphor 4, the moisture-proof layer 5, the adhesive layer 6, and the sealing member 7, but may include these members as necessary.

[Configuration of Scintillator Panel Unit]

Figure 2:
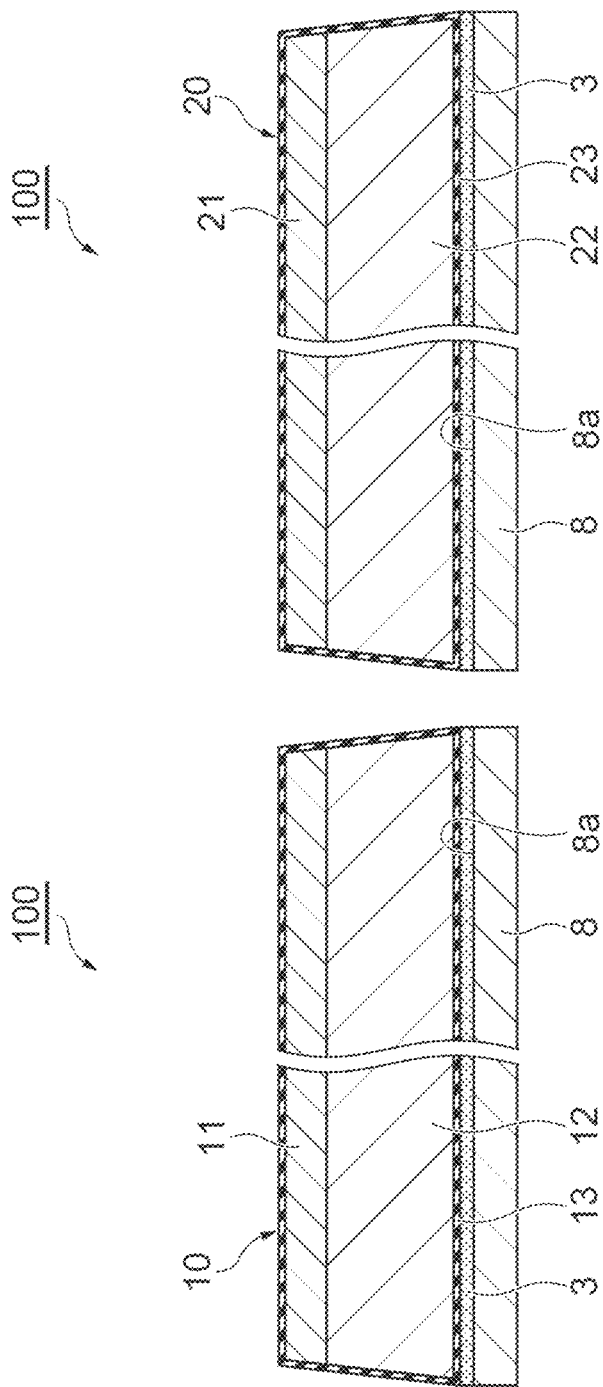
FIG. 2 is a cross-sectional view of a scintillator panel unit of an embodiment.

As illustrated in FIG. 2, one scintillator panel unit 100 of a pair of scintillator panel units 100 includes a first scintillator panel 10, an adhesive layer 3, and a release sheet 8. The other scintillator panel unit 100 of the pair of scintillator panel units 100 includes a second scintillator panel 20, an adhesive layer 3, and a release sheet 8. The pair of scintillator panel units 100 is used, for example, when the radiation detector 1 is manufactured.

In the one scintillator panel unit 100, the release sheet 8 covers the adhesive layer 3 from a side opposite to the first scintillator panel 10. In the other scintillator panel unit 100, the release sheet 8 covers the adhesive layer 3 from a side opposite to the second scintillator panel 20. The adhesive force of the adhesive layer 3 with respect to a surface 8a of the release sheet 8 is lower than the adhesive force of the adhesive layer 3 with respect to the first scintillator panel 10 and the second scintillator panel 20. Note that, in the scintillator panel unit 100, the adhesive layer 3 is a pressure-sensitive adhesive layer.

The first scintillator panel 10 is disposed on the adhesive layer 3 in a state where the first scintillator layer 12 is positioned on the adhesive layer 3 side with respect to the first substrate 11. The second scintillator panel 20 is disposed on the adhesive layer 3 in a state where the second scintillator layer 22 is positioned on the adhesive layer 3 side with respect to the second substrate 21. That is, the method of disposing the first scintillator panel 10 on the adhesive layer 3 of the one scintillator panel unit 100 is the same as the method of disposing the first scintillator panel 10 on the adhesive layer 3 of the radiation detector 1 described above. The method of disposing the second scintillator panel 20 on the adhesive layer 3 of the other scintillator panel unit 100 is the same as the method of disposing the second scintillator panel 20 on the adhesive layer 3 of the radiation detector 1 described above.

In the one scintillator panel unit 100, the first scintillator panel 10 has a first protective layer 13 covering the first substrate 11 and the first scintillator layer 12. In the other scintillator panel unit 100, the second scintillator panel 20 has a second protective layer 23 covering the second substrate 21 and the second scintillator layer 22. Thereby, the plurality of columnar crystals having deliquescent properties can be protected.

[Method for Manufacturing Radiation Detector]

A method for manufacturing the radiation detector 1 will be described. In the present embodiment, the aforementioned pair of scintillator panel units 100 is used.

First, the sensor panel 2 is prepared (a step of preparing the sensor panel 2). Subsequently, in a state of the pair of the scintillator panel units 100 illustrated in FIG. 2, the first scintillator panel 10 and the second scintillator panel 20 are prepared (a step of preparing the first scintillator panel 10 and the second scintillator panel 20). In the step of preparing the first scintillator panel 10 and the second scintillator panel 20, each of the first angle θ1 and the second angle θ2 is 45 degrees or more and less than 90 degrees (see FIG. 1). Note that, any one of the step of preparing the sensor panel 2 and the step of preparing the first scintillator panel 10 and the second scintillator panel 20 may be previously performed, and both of the steps may be simultaneously performed.

Figure 3:
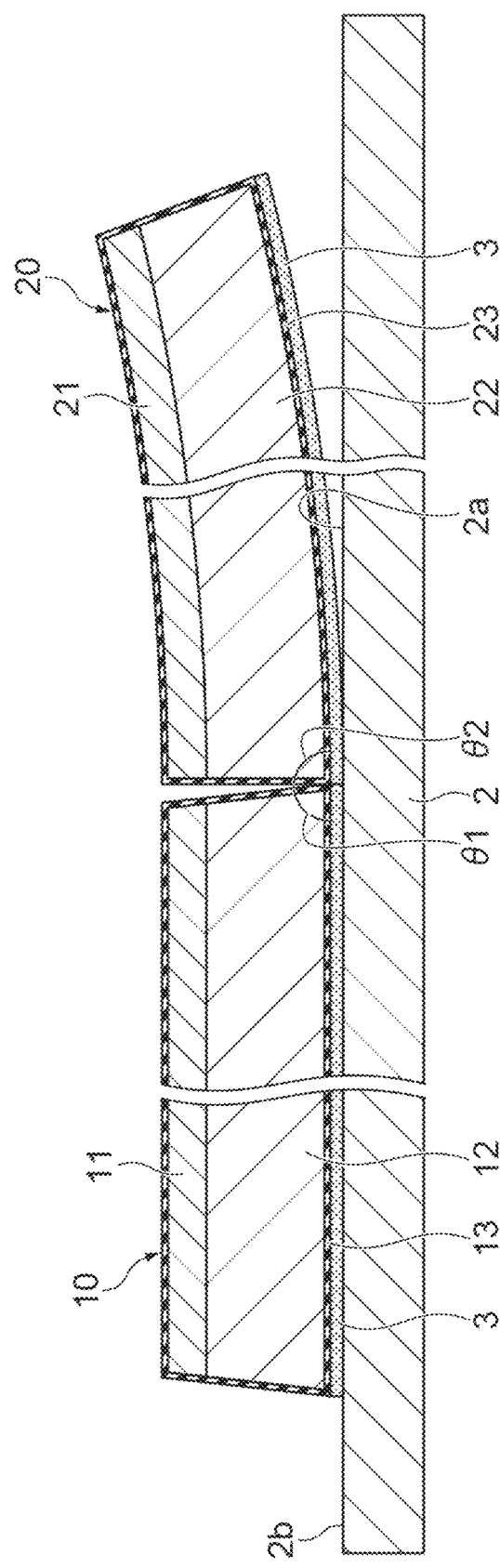
FIG. 3 is a cross-sectional view of a radiation detector in one step of a method for manufacturing a radiation detector of an embodiment.

Subsequently, the release sheet 8 is released from the first scintillator panel 10 and the adhesive layer 3 in the one scintillator panel unit 100, and as illustrated in FIG. 3, the first scintillator panel 10 is attached to the light receiving surface 2a by the adhesive layer 3 (an attaching step). Further, the release sheet 8 is released from the second scintillator panel 20 and the adhesive layer 3 in the other scintillator panel unit 100, and as illustrated in FIG. 3, the second scintillator panel 20 is attached to the light receiving surface 2a by the adhesive layer 3 (an attaching step). That is, each of the first scintillator panel 10 and the second scintillator panel 20 is disposed on the light receiving surface 2a (a step of disposing each of the first scintillator panel 10 and the second scintillator panel 20). In the attaching step, the adhesive layer 3 is separated for each of the first scintillator panel 10 and the second scintillator panel 20. In the attaching step, before each of the first scintillator panel 10 and the second scintillator panel 20 is attached to the light receiving surface 2a, the adhesive layer 3 is disposed on each of the first scintillator panel 10 and the second scintillator panel 20.

In the attaching step, since the first substrate 11 and the second substrate 21 each have flexibility, while the first scintillator panel 10 and the second scintillator panel 20 each are deflected, each of the first scintillator panel 10 and the second scintillator panel 20 can be gradually attached to the light receiving surface 2a from one side. At this time, the corner portion of the second scintillator panel 20 formed by the surface 20a and the side surface 20b can be reliably brought into contact with the corner portion of the first scintillator panel 10 formed by the surface 10a and the side surface 10b.

Subsequently, as illustrated in FIG. 1, the first scintillator panel 10 and the second scintillator panel 20 are covered with the moisture-proof layer 5 on the sensor panel 2. That is, the moisture-proof layer 5 is disposed on the first scintillator panel 10 and the second scintillator panel 20 on a side opposite to the sensor panel 2 (a step of disposing the moisture-proof layer 5). In the step of disposing the moisture-proof layer 5, the moisture-proof layer 5 is provided continuous over the first scintillator panel 10 and the second scintillator panel 20. Subsequently, in the surface 2b of the sensor panel 2, the outer edge 5a of the moisture-proof layer 5 is sealed by the sealing member 7 to obtain the radiation detector 1. In the present embodiment, the step of disposing each of the first scintillator panel 10 and the second scintillator panel 20 is performed before the step of disposing the moisture-proof layer 5.

According to the method for manufacturing the radiation detector 1 described above, the aforementioned radiation detector 1 can be easily and reliably obtained.

In the method for manufacturing the radiation detector 1, in the attaching step, before each of the first scintillator panel 10 and the second scintillator panel 20 is attached to the light receiving surface 2a, the adhesive layer 3 is disposed on each of the first scintillator panel 10 and the second scintillator panel 20. Thereby, the first scintillator panel 10 and the adhesive layer 3 can be handled in a state of being integrated with each other. Similarly, the second scintillator panel 20 and the adhesive layer 3 can be handled in a state of being integrated with each other.

In the method for manufacturing the radiation detector 1, the step of disposing each of the first scintillator panel 10 and the second scintillator panel 20 is performed before the step of disposing the moisture-proof layer 5. Thereby, when the moisture-proof layer 5 is disposed on the first scintillator panel 10 and the second scintillator panel 20 on a side opposite to the sensor panel 2, the sensor panel 2, the first scintillator panel 10, and the second scintillator panel 20 can be handled in a state of being integrated with one another.

Modification Example

Figure 5:
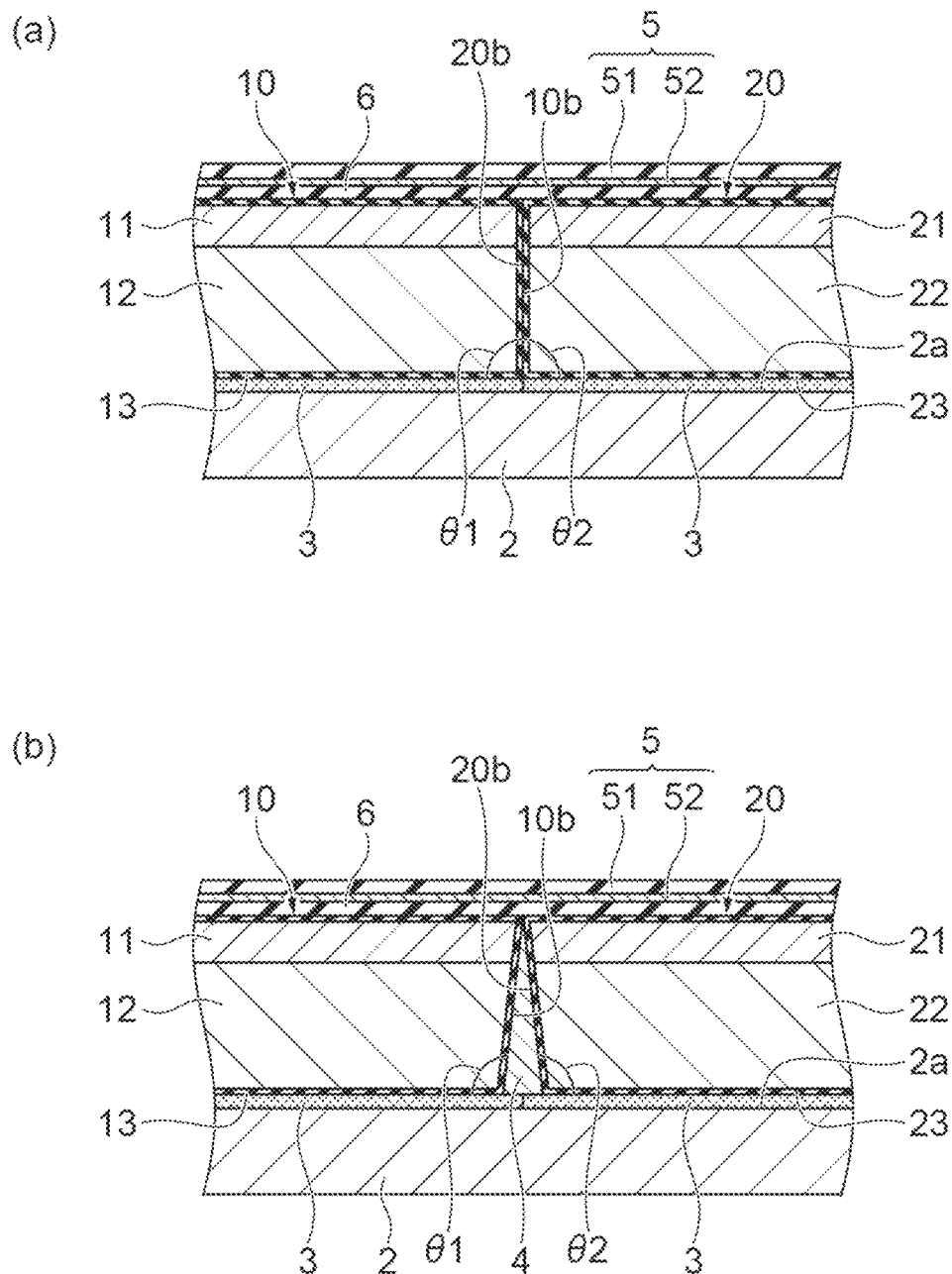
FIG. 5 is a cross-sectional view of a part of the radiation detector of the modification example.

The present disclosure is not limited to the aforementioned embodiments. In the radiation detector 1, as illustrated in (a) of FIG. 5, each of the first angle $\theta 1$ and the second angle $\theta 2$ may be 90 degrees. Alternatively, in the radiation detector 1, as illustrated in (b) of FIG. 5, each of the first angle $\theta 1$ and the second angle $\theta 2$ may exceed 90 degrees. In this case, the granular phosphor 4 may be disposed between the side surface 10b of the first scintillator panel 10 and the side surface 20b of the second scintillator panel 20. The same fact that each of the first angle $\theta 1$ and the second angle $\theta 2$ may be 90 degrees or more as described above applies in the scintillator panel unit 100 and the method for manufacturing the radiation detector 1 described above.

Figure 6:
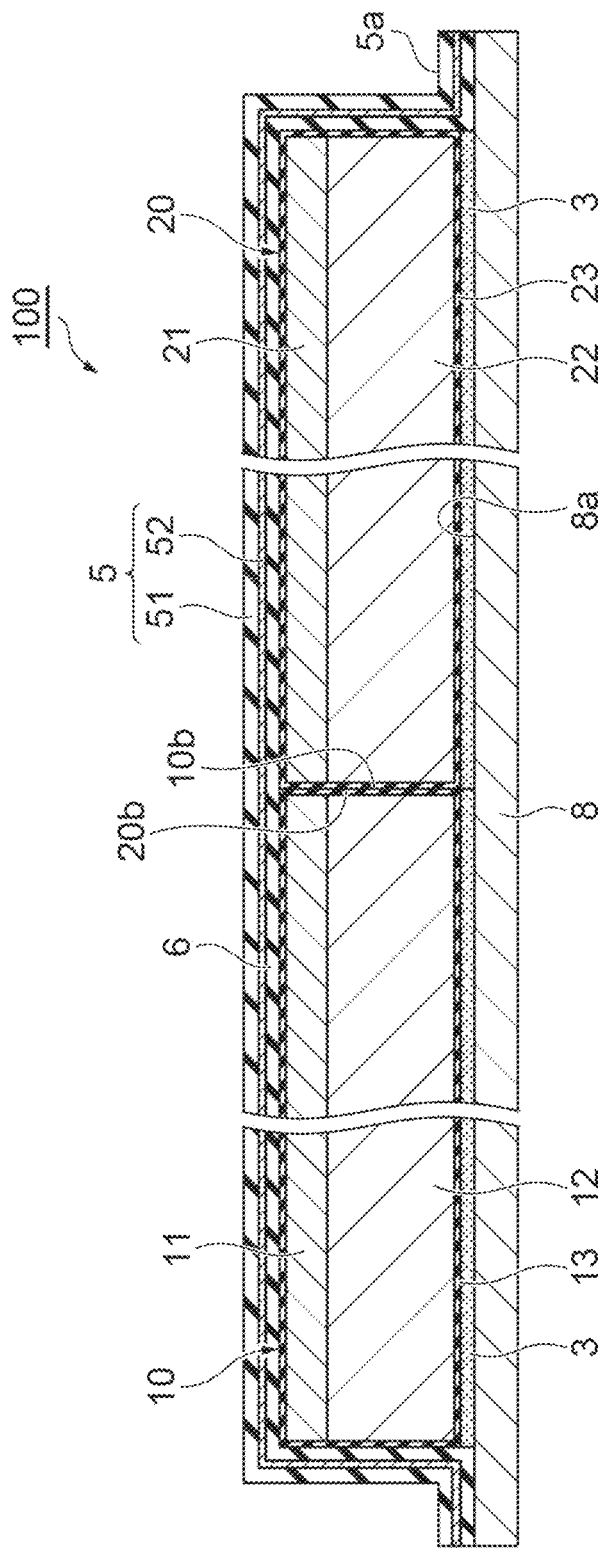
FIG. 6 is a cross-sectional view of a scintillator panel unit of a modification example.

As illustrated in FIG. 6, the scintillator panel unit 100 may include the moisture-proof layer 5 as a support layer, and the first scintillator panel 10 and the second scintillator panel 20 disposed on the moisture-proof layer 5 in a state of being adjacent to each other along the moisture-proof layer 5. The configuration of the scintillator panel unit 100 illustrated in FIG. 6 is as follows. That is, the moisture-proof layer 5 is provided continuous over the first scintillator panel 10 and the second scintillator panel 20. The first scintillator panel 10 is disposed on the moisture-proof layer 5 in a state where the first substrate 11 is positioned on the moisture-proof layer 5 side with respect to the first scintillator layer 12. The second scintillator panel 20 is disposed on the moisture-proof layer 5 in a state where the second substrate 21 is positioned on the moisture-proof layer 5 side with respect to the second scintillator layer 22.

In the scintillator panel unit 100 illustrated in FIG. 6, the moisture-proof layer 5 covers the first scintillator panel 10 and the second scintillator panel 20, and the adhesive layer 6 is disposed between the first scintillator panel 10 and the moisture-proof layer 5 and between the second scintillator panel 20 and the moisture-proof layer 5. Further, the adhesive layer 3 is disposed between the first scintillator panel 10 and the release sheet 8 and between the second scintillator panel 20 and the release sheet 8, and the adhesive layer 6 is disposed between the outer edge 5a of the moisture-proof layer 5 and the release sheet 8. The adhesive layer 3 and the adhesive layer 6 each are a pressure-sensitive adhesive layer. The adhesive force of the adhesive layer 3 with respect to the surface 8a of the release sheet 8 is lower than the adhesive force of the adhesive layer 3 with respect to the first scintillator panel 10 and the second scintillator panel 20. The adhesive force of the adhesive layer 6 with respect to the surface 8a of the release sheet 8 is lower than the adhesive force of the adhesive layer 6 with respect to the outer edge 5a of the moisture-proof layer 5. According to the scintillator panel unit 100 illustrated in FIG. 6, the first scintillator panel 10, the second scintillator panel 20, and the moisture-proof layer 5 can be handled in a state of being integrated with one another. Note that, the scintillator panel unit 100 illustrated in FIG. 6 may not include the adhesive layer 3, a portion of the adhesive layer 6 disposed on the outer edge 5a, and the release sheet 8.

Figure 7:
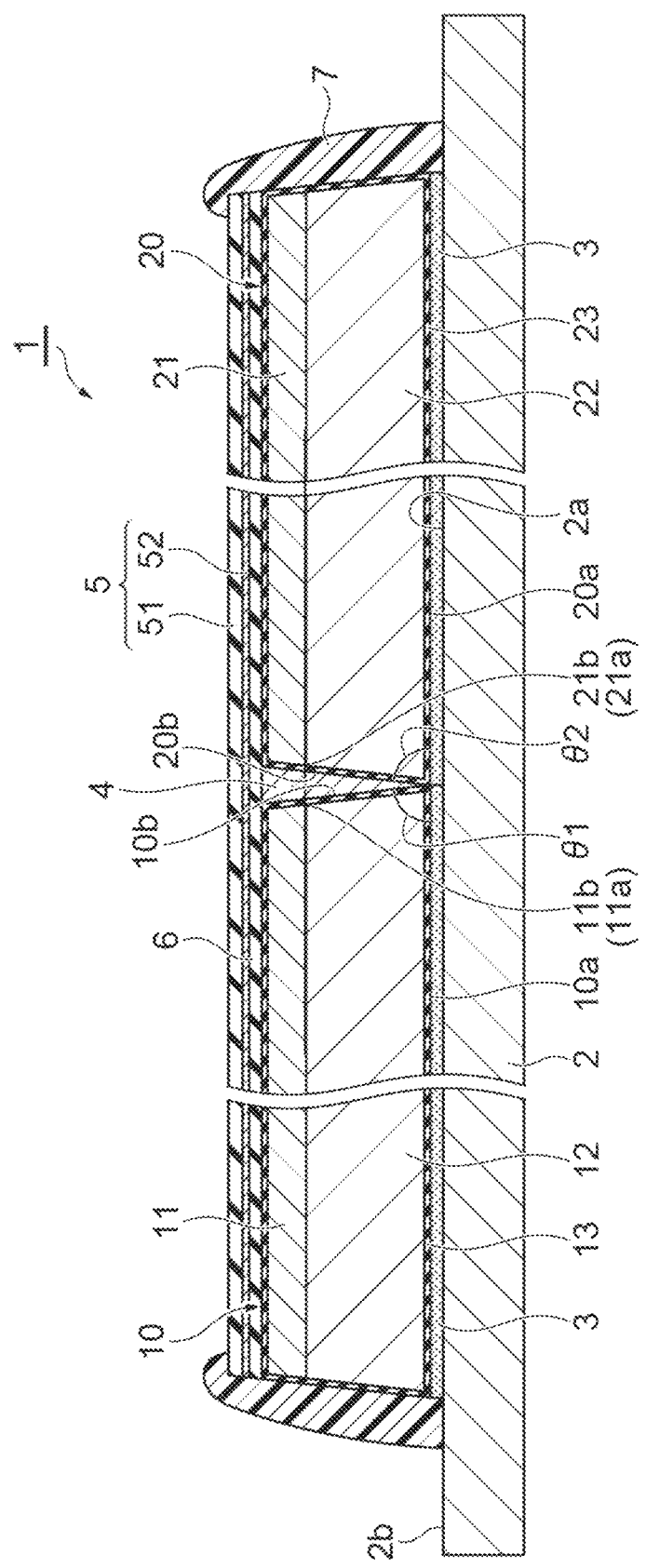
FIG. 7 is a cross-sectional view of a radiation detector of a modification example.

As illustrated in FIG. 7, in the radiation detector 1, the outer edge of the moisture-proof layer 5 may be positioned on the first scintillator panel 10 and the second scintillator panel 20, and the sealing member 7 may seal the side surfaces outside the first scintillator panel 10 and the second scintillator panel 20 and the side surface outside the moisture-proof layer 5 in the surface 2b of the sensor panel 2.

Figure 8:
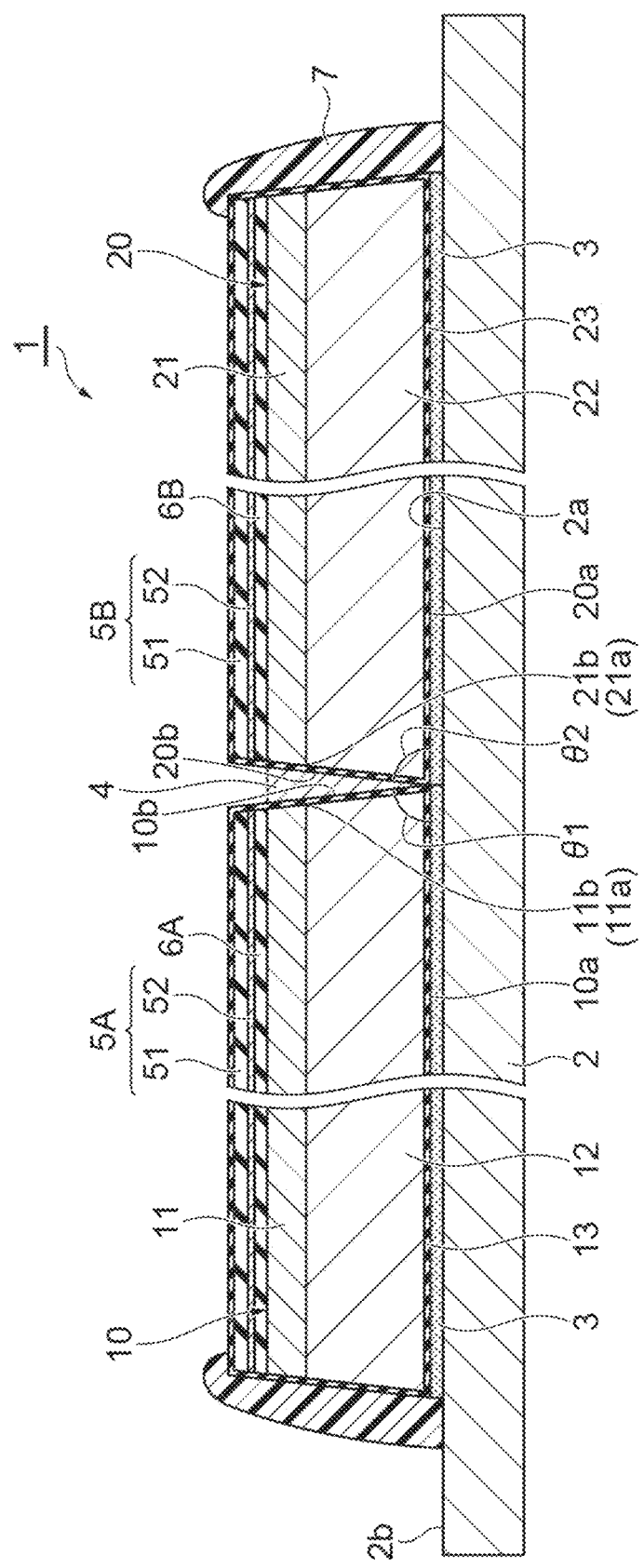
FIG. 8 is a cross-sectional view of a radiation detector of a modification example.

As illustrated in FIG. 8, in the radiation detector 1, a first moisture-proof layer 5A may be disposed on the first scintillator panel 10 on a side opposite to the sensor panel 2, and a second moisture-proof layer 5B may be disposed on the second scintillator panel 20 on a side opposite to the sensor panel 2. In this case, the first protective layer 13 may cover the first scintillator panel 10 and the first moisture-proof layer 5A, and the second protective layer 23 may cover the second scintillator panel 20 and the second moisture-proof layer 5B. The configurations of the first moisture-proof layer 5A and the second moisture-proof layer 5B are the same as the configuration of the moisture-proof layer 5 described above. In the radiation detector 1 illustrated in FIG. 8, the sealing member 7 seals the side surfaces outside the first scintillator panel 10 and the second scintillator panel 20 and the side surfaces outside of the first moisture-proof layer 5A and the second moisture-proof layer 5B, in the surface 2b of the sensor panel 2. According to the radiation detector 1 illustrated in FIG. 8, the plurality of columnar crystals having deliquescent properties can be protected.

Figure 9:
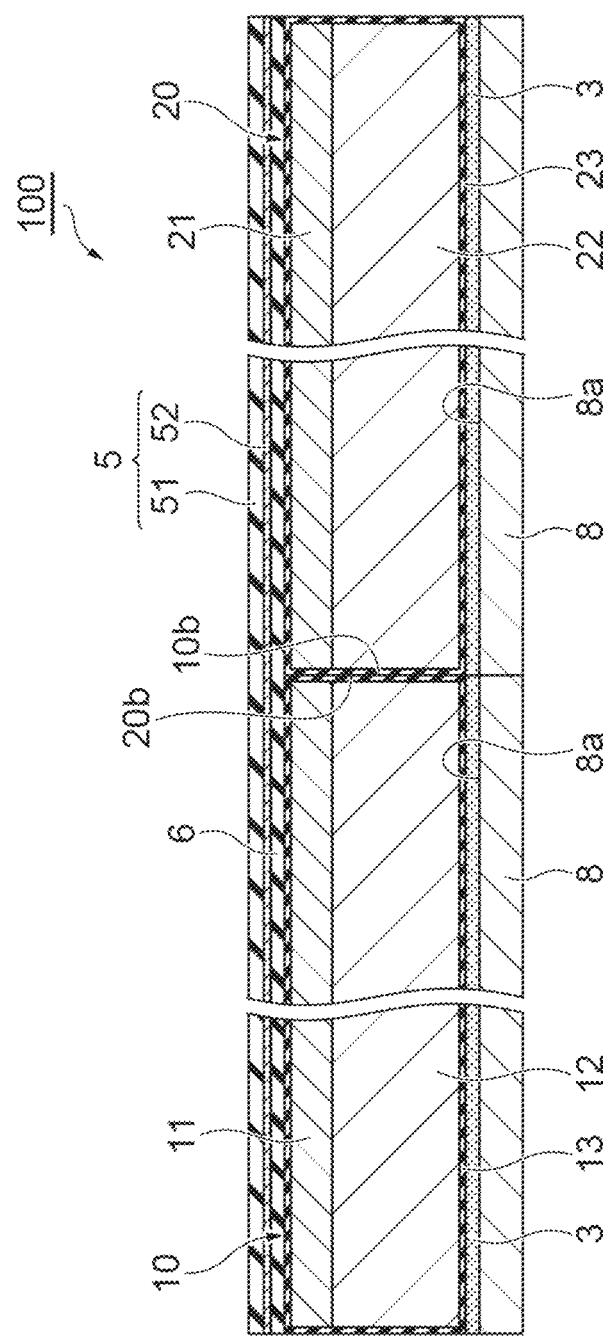
FIG. 9 is a cross-sectional view of a scintillator panel unit of a modification example.

As illustrated in FIG. 9, in the scintillator panel unit 100, the outer edge of the moisture-proof layer 5 may be positioned on the first scintillator panel 10 and the second scintillator panel 20. In the scintillator panel unit 100 illustrated in FIG. 9, the adhesive layer 3 and the release sheet 8 are separated for each of the first scintillator panel 10 and the second scintillator panel 20. Note that, the scintillator panel unit 100 illustrated in FIG. 9 may not include the adhesive layer 3 and the release sheet 8.

In the radiation detector 1 and the scintillator panel unit 100, the first substrate 11 and the second substrate 21 each may not have flexibility. In this case, the material for each of the first substrate 11 and the second substrate 21 may be, for example, CFRP (carbon fiber reinforced plastic), a-C (amorphous carbon), Al, Cu, or glass. When the material for each of the first substrate 11 and the second substrate 21 is a metal, a functional film (such as a polyparaxylene film) may be formed, for example, as corrosion-resistant coating, on the front surface and the back surface of each of the first substrate 11 and the second substrate 21. This functional film may be a laminate film including a plurality of films each having a different function. As an example, when the material for each of the first substrate 11 and the second substrate 21 is Al, an alumite (anodized alumina) film and a polyparaxylene film may be formed on the front surface and the back surface of each of the first substrate 11 and the second substrate 21. In the radiation detector 1 and the scintillator panel unit 100, each of the first substrate 11 and the second substrate 21 may be a laminate substrate including a plurality of substrates (for example, a CFRP substrate and a PET substrate).

In the radiation detector 1 and the scintillator panel unit 100, the first scintillator layer 12 may reach at least the first portion 11b of the outer edge 11a of the first substrate 11. Similarly, the second scintillator layer 22 may reach at least the second portion 21b of the outer edge 11a of the second substrate 21. In the radiation detector 1 and the scintillator panel unit 100, the first substrate 11 and the first scintillator layer 12 are not limited to those obtained by cutting or clipping, and the first scintillator layer 12 may reach the side surface of the first substrate 11. Similarly, the second substrate 21 and the second scintillator layer 22 are not limited to those obtained by cutting or clipping, and the second scintillator layer 22 may reach the side surface of the second substrate 21.

In the radiation detector 1, the sensor panel 2 may not have flexibility. In this case, the material for the substrate provided with a plurality of photoelectric conversion elements in the sensor panel 2 is, for example, a-Si (amorphous silicon), Si (silicon), or glass (for example, alkali-free glass). In the radiation detector 1, the outer edge 5a of the moisture-proof layer 5 may reach the surface 2b of the sensor panel 2 around the light receiving surface 2a, and the sealing member 7 may seal the outer edge 5a of the moisture-proof layer 5 in the surface 2b of the sensor panel 2 in a state where a region defined by the sensor panel 2 and the moisture-proof layer 5 is decompressed. In this case, the moisture-proof layer 5 can be brought into close contact with the first scintillator panel 10 and the second scintillator panel 20 without using the adhesive layer 3. In the radiation detector 1, the moisture-proof layer 5 formed in a hat shape may cover the first scintillator panel 10 and the second scintillator panel 20 in the sensor panel 2, and the sealing member 7 may seal the outer edge 5a of the moisture-proof layer 5 in the surface 2b of the sensor panel 2.

The radiation detector 1 and the scintillator panel unit 100 may not include the moisture-proof layers 5, 5A, and 5B. The radiation detector 1 and the scintillator panel unit 100 may not include the first protective layer 13 and the second protective layer 23.

In the method for manufacturing the radiation detector 1, in the attaching step, before each of the first scintillator panel 10 and the second scintillator panel 20 is attached to the light receiving surface 2a, the adhesive layer 3 may be disposed on the light receiving surface 2a. In this case, the first scintillator panel 10 and the second scintillator panel 20 can be each independently handled. In the method for manufacturing the radiation detector 1, the step of disposing the moisture-proof layer 5 may be performed before the step of disposing each of the first scintillator panel 10 and the second scintillator panel 20. In this case, when each of the first scintillator panel 10 and the second scintillator panel 20 is disposed on the light receiving surface 2a, the first scintillator panel 10, the second scintillator panel 20, and the moisture-proof layer 5 can be handled in a state of being integrated with one another.

All of embodiments, modification examples, and the like of the radiation detector 1, the scintillator panel unit 100, and the method for manufacturing the radiation detector 1 described above may include, as a plurality of scintillator panels disposed one-dimensionally or two-dimensionally, the first scintillator panel 10 and the second scintillator panel 20. For example, when three scintillator panels are disposed one-dimensionally, any "two adjacent scintillator panels" can be regarded as the first scintillator panel 10 and the second scintillator panel 20. Furthermore, when four scintillator panels are disposed two-dimensionally, any "two adjacent scintillator panels" can be regarded as the first scintillator panel 10 and the second scintillator panel 20.

REFERENCE SIGNS LIST

1: radiation detector, 2: sensor panel, 2a: light receiving surface, 3: adhesive layer, 4: granular phosphor, 5A: first moisture-proof layer, 5B: second moisture-proof layer, 10: first scintillator panel, 11: first substrate, 11a: outer edge, 11b: first portion, 12: first scintillator layer, 13: first protective layer, 20: second scintillator panel, 21: second substrate, 21a: outer edge, 21b: second portion, 22: second scintillator layer, 23: second protective layer.

The invention claimed is:

1. A radiation detector comprising:
a sensor panel having a light receiving surface;
a first scintillator panel and a second scintillator panel disposed on the light receiving surface in a state of being adjacent to each other along the light receiving surface; and
an adhesive layer disposed between the light receiving surface and the first scintillator panel and between the light receiving surface and the second scintillator panel, wherein
the first scintillator panel has a first substrate and a first scintillator layer including a plurality of columnar crystals formed on the first substrate,
the second scintillator panel has a second substrate and a second scintillator layer including a plurality of columnar crystals formed on the second substrate,
the first scintillator panel is attached to the light receiving surface by the adhesive layer in a state where the first scintillator layer is positioned on the light receiving surface side with respect to the first substrate,
the second scintillator panel is attached to the light receiving surface by the adhesive layer in a state where the second scintillator layer is positioned on the light receiving surface side with respect to the second substrate,
an outer edge of the first substrate when viewed from the first scintillator layer side includes a first portion extending along the second scintillator panel, and the first scintillator layer reaches at least the first portion,
an outer edge of the second substrate when viewed from the second scintillator layer side includes a second portion extending along the first scintillator panel, and the second scintillator layer reaches at least the second portion, and
the adhesive layer is separated for each of the first scintillator panel and the second scintillator panel.

2. The radiation detector according to claim 1, wherein the first substrate and the second substrate each have flexibility.

3. The radiation detector according to claim 1, wherein the first scintillator panel has a rectangular shape having a one-side length of 300 mm or more when viewed from a thickness direction of the first substrate, and
the second scintillator panel has a rectangular shape having a one-side length of 300 mm or more when viewed from a thickness direction of the second substrate.

4. The radiation detector according to claim 1, wherein the adhesive layer contains a pressure-sensitive adhesive or an adhesive.

5. The radiation detector according to claim 1, wherein the first scintillator panel further has a first protective layer covering the first substrate and the first scintillator layer, and
the second scintillator panel further has a second protective layer covering the second substrate and the second scintillator layer.

6. The radiation detector according to claim 1, further comprising:
a first moisture-proof layer disposed on the first scintillator panel on a side opposite to the sensor panel;
a second moisture-proof layer disposed on the second scintillator panel on a side opposite to the sensor panel;
a first protective layer covering the first scintillator panel and the first moisture-proof layer; and
a second protective layer covering the second scintillator panel and the second moisture-proof layer.

7. The radiation detector according to claim 1, further comprising a granular phosphor disposed between the first scintillator panel and the second scintillator panel.

8. A method for manufacturing the radiation detector according to claim 1, the method comprising:
a step of preparing the sensor panel;
a step of preparing the first scintillator panel and the second scintillator panel; and
a step of attaching each of the first scintillator panel and the second scintillator panel to the light receiving surface by the adhesive layer, wherein
in the attaching step, the adhesive layer is separated for each of the first scintillator panel and the second scintillator panel.

9. The method for manufacturing the radiation detector according to claim 8, wherein in the attaching step, before each of the first scintillator panel and the second scintillator panel is attached to the light receiving surface, the adhesive layer is disposed on each of the first scintillator panel and the second scintillator panel.

10. The method for manufacturing the radiation detector according to claim 8, wherein in the attaching step, before each of the first scintillator panel and the second scintillator panel is attached to the light receiving surface, the adhesive layer is disposed on the light receiving surface.

* * * * *